(12) United States Patent
Yamamoto et al.

(10) Patent No.: US 11,031,249 B2
(45) Date of Patent: Jun. 8, 2021

(54) ELECTRONIC DEVICE WITH A GATE INSULATING FILM AND A CAP LAYER OF SILICON NITRIDE HAVING CRYSTALLINITY

(71) Applicant: SUMITOMO CHEMICAL COMPANY, LIMITED, Tokyo (JP)

(72) Inventors: Taiki Yamamoto, Tsukuba (JP); Takenori Osada, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 68 days.

(21) Appl. No.: 16/453,595

(22) Filed: Jun. 26, 2019

(65) Prior Publication Data

US 2019/0318934 A1 Oct. 17, 2019

Related U.S. Application Data

(63) Continuation of application No. PCT/JP2017/045166, filed on Dec. 15, 2017.

(30) Foreign Application Priority Data

Dec. 27, 2016 (JP) .............................. JP2016-252382

(51) Int. Cl.
*H01L 29/10* (2006.01)
*H01L 29/778* (2006.01)
(Continued)

(52) U.S. Cl.
CPC .......... *H01L 21/31* (2013.01); *H01L 21/0217* (2013.01); *H01L 21/0242* (2013.01);
(Continued)

(58) Field of Classification Search
CPC ......... H01L 29/66431; H01L 29/66462; H01L 29/778–7789; H01L 29/2003;
(Continued)

(56) References Cited

U.S. PATENT DOCUMENTS

2005/0164482 A1 7/2005 Saxler
2014/0094223 A1* 4/2014 Dasgupta .............. H01L 23/535
455/566
(Continued)

FOREIGN PATENT DOCUMENTS

JP 2013-225621 A 10/2013
JP 2015-46441 A 3/2015

OTHER PUBLICATIONS

International Search Report (PCT/ISA/210), issued in PCT/JP2017/045166, dated Mar. 6, 2018.
(Continued)

*Primary Examiner* — Younes Boulghassoul
(74) *Attorney, Agent, or Firm* — Birch, Stewart, Kolasch & Birch, LLP

(57) ABSTRACT

A semiconductor wafer is provided, which includes a wafer; a nitride crystal layer formed of one or more crystal layers of group III nitride; and a cap layer; the wafer, the nitride crystal layer and the cap layer are positioned in an order of the wafer, the nitride crystal layer and the cap layer, and the cap layer is a silicon nitride layer having crystallinity and has a thickness of 5 nm or more. Also, a semiconductor wafer is provided, where a layer that is of the nitride crystal layer and that is in contact with the cap layer, and a layer near the layer function as active layers of a field-effect transistor, the cap layer is a silicon nitride layer having crystallinity and a thickness that is equal to or larger than a thickness in which a gate of the field-effect transistor can be embedded.

6 Claims, 7 Drawing Sheets

(51) Int. Cl.
*H01L 29/812* (2006.01)
*H01L 29/20* (2006.01)
*H01L 29/08* (2006.01)
*H01L 21/31* (2006.01)
*H01L 21/02* (2006.01)
*H01L 29/66* (2006.01)
*H01L 29/78* (2006.01)

(52) U.S. Cl.
CPC ...... *H01L 21/0254* (2013.01); *H01L 21/0262* (2013.01); *H01L 21/02211* (2013.01); *H01L 21/02271* (2013.01); *H01L 21/02381* (2013.01); *H01L 21/02458* (2013.01); *H01L 21/02502* (2013.01); *H01L 21/02507* (2013.01); *H01L 21/02576* (2013.01); *H01L 29/1075* (2013.01); *H01L 29/66462* (2013.01); *H01L 29/778* (2013.01); *H01L 29/7786* (2013.01); *H01L 29/78* (2013.01); *H01L 29/812* (2013.01); *H01L 29/0847* (2013.01); *H01L 29/2003* (2013.01)

(58) Field of Classification Search
CPC . H01L 29/201; H01L 29/205; H01L 21/0254; H01L 21/02458; H01L 21/0217; H01L 21/0242
See application file for complete search history.

(56) References Cited

U.S. PATENT DOCUMENTS

| | | | |
|---|---|---|---|
| 2014/0151637 A1 | 6/2014 | Xiao | |
| 2014/0209919 A1* | 7/2014 | Chiu | H01L 29/66462 |
| | | | 257/76 |
| 2015/0008444 A1* | 1/2015 | Derluyn | H01L 29/205 |
| | | | 257/76 |
| 2015/0060861 A1* | 3/2015 | Chiu | H01L 29/7787 |
| | | | 257/66 |
| 2015/0060873 A1* | 3/2015 | Chiu | H01L 29/66462 |
| | | | 257/76 |
| 2015/0279982 A1* | 10/2015 | Yamamoto | H01L 29/66462 |
| | | | 257/76 |
| 2015/0349117 A1* | 12/2015 | Chu | H01L 29/66462 |
| | | | 257/66 |
| 2016/0233329 A1* | 8/2016 | Cheng | H01L 29/7787 |
| 2016/0315179 A1 | 10/2016 | Nishimori et al. | |
| 2017/0125564 A1* | 5/2017 | Kotani | H01L 29/7786 |
| 2017/0236906 A1* | 8/2017 | Yamada | H01L 21/02505 |
| | | | 250/395 |
| 2017/0301780 A1* | 10/2017 | Boles | H01L 29/401 |
| 2019/0280091 A1* | 9/2019 | Yamamoto | C23C 16/30 |
| 2019/0296136 A1* | 9/2019 | Yamamoto | H01L 21/02505 |
| 2019/0348532 A1* | 11/2019 | Romanczyk | H01L 29/1029 |

OTHER PUBLICATIONS

Written Opinion of the International Searching Authority (PCT/ISA/237), issued in PCT/JP2017/045166, dated Mar. 6, 2018.
Extended European Search Report dated Jul. 17, 2020 for Application No. 17888472.2.
Sacconi et al., "Strain effects in SiN-passivated GaN-based HEMT devices", J Comput Electron, vol. 5, 2006, pp. 115-118.
Japanese Office Action for Japanese Application No. 2016-252382, dated Sep. 15, 2020, with English translation.

* cited by examiner

ELECTRONIC DEVICE WITH A GATE INSULATING FILM AND A CAP LAYER OF SILICON NITRIDE HAVING CRYSTALLINITY

CROSS REFERENCE TO RELATED APPLICATIONS

This application is a Continuation of PCT International Application No. PCT/JP2017/045166, filed on Dec. 15, 2017, which claims priority under 35 U.S.C. 119(a) to Patent Application No. 2016-252382, filed in Japan on Dec. 27, 2016, all of which are hereby expressly incorporated by reference into the present application.

BACKGROUND

1. Technical Field

The present invention relates to a semiconductor wafer and an electronic device.

2. Related Art

For example, Patent Document 1 has disclosed a method of manufacturing a semiconductor device, to stably and effectively perform thermal treatment at a high temperature while preventing nitrogen leakage from a nitride-based semiconductor layer. In the document, it has been described that after an n-$Al_xGa_{1-x}N$ layer 12 is formed on an n-GaN wafer 11, impurities are doped in the n-$Al_xGa_{1-x}N$ layer 12, and a first cap layer 2a formed of $Al_yGa_{1-y}$)N and a second cap layer 2b formed of $Al_zGa_{1-z}N$ that are epitaxial films are sequentially formed on a surface of the n-$Al_xGa_{1-x}N$ layer 12 by an MOCVD method to form a treated wafer 2. However, an Al composition ratio y is larger than an Al composition ratio x and is also larger than an Al composition ratio z.

For example, in the Patent Document 2, a semiconductor device and a method of manufacturing the semiconductor device to obtain a semiconductor device that realizes both high blocking voltage and large current and has an excellent heterojunction characteristic has been disclosed. In the document, it has been described that the semiconductor device includes an electron channel layer 3 that is formed of GaN; an electron supplying layer 4 that is formed of AlGaN, is provided on the electron channel layer 3 and supplies electrons to 2DEG; a first gap layer 5 that is formed of an undoped semiconductor, is provided on the electron supplying layer 4, and has an opening that is opened so as to surround a gate electrode 11; and a second gap layer 6 that is formed of an n type semiconductor, is provided only on the first gap layer 5, and has an opening being opened on a downstream side of a gate electrode in a flowing direction of electrons of 2DEG and having a larger opening width than the opening of the first gap layer 5 in the flowing direction of electrons of 2DEG, where an electron channel layer formed of GaN, an electron supplying layer formed of AlGaN, a first gap layer and a second gap layer are generated according to a continuous epitaxial growth process.

In these Patent Documents 1 and 2, to reduce defects caused by annealing and the like during a semiconductor device manufacturing process or to adjust band potential in the semiconductor device, a cap layer formed of AlGaN is formed on an electron supplying layer (in the cited document 1, the n-$Al_xGa_{1-x}N$ layer 12, and in the cited document 2, the electron supplying layer 4).

PRIOR ART LITERATURE

Patent Document

[Patent Document 1] Japanese Patent Application Publication No. 2015-46441
[Patent Document 2] Japanese Patent Application Publication No. 2013-225621

SUMMARY

The inventors of the present application figured out that the presence of the above-described cap layer not only realizes the purposes described in the Patent Documents 1 and 2 but also contributes to protection of channel forming layers (the n-GaN wafer 11 and the n-$Al_xGa_{1-x}N$ layer 12 in the cited document 1 and the electron channel layer 3 formed of GaN and the electron supplying layer 4 formed of AlGaN in the cited document 2) during the epitaxial growth process.

That is, the group III nitride crystal layer, such as a GaN, AlGaN, and AlN layer, is crystal-grown with defect repair by hydrogen etching at the time of epitaxial growth by a Metal Organic Chemical Vapor Deposition (MOCVD) Method. A growth temperature for the epitaxial growth is generally a high temperature of approximately 1000° C., and after the epitaxial growth is ended, in a step in which the temperature is decreased to approximately 600° C., an epitaxially grown surface is exposed in hydrogen atmosphere, and defects may occur in the epitaxial wafer due to the etching by the atmosphere. From the view point of preventing defects from occurring due to such an etching, it is meaningful to form a cap layer on the uppermost surface of an epitaxially grown layer. When the cap layer is GaN or AlGaN, a solution to form the cap layer or the like is considered by taking into account in advance that the cap layer should have a thickness that can be decreased by the etching into a desired thickness.

However, when the cap layer is GaN or AlGaN, as also described in Patent Document 1 and the like, the thickness or composition affects characteristic of a semiconductor device, such as a transistor, which is to be formed later. For this reason, it is preferable to control the thickness, the composition or the like of the cap layer as precisely as possible. However, even in the method of forming the cap layer having a larger thickness by taking into account in advance that the etching that is performed after the epitaxial growth is ended, it is difficult to perform a precise thickness control on the cap layer.

Also, to use a cap layer for a control of band potential in a semiconductor device such as a transistor, uniformity of the thickness within a wafer surface is a crucial factor for enhancing a yield of the semiconductor device.

Further, it is preferable to have a high degree of freedom in designing for development of a semiconductor device such as a transistor, and for that reason, it is desirable to provide various cap layers to respond to a request of design diversity.

The present invention is to provide a technology of a cap layer that is not affected or is slightly affected by the etching by hydrogen atmosphere in an epitaxial growth ending step. Also, the present invention is to provide a technology of a cap layer that can respond to the request for a high degree of freedom in designing. Further, the present invention is to provide a technology of a cap layer that can realize high film thickness uniformity within a wafer surface.

To solve the above-described issue, in a first aspect of the present invention, a semiconductor wafer is provided, which includes a wafer, a nitride crystal layer formed of one or more crystal layers of group III nitride, and a cap layer, where the wafer, the nitride crystal layer and the cap layer are positioned in an order of the wafer, the nitride crystal layer and the cap layer, and the cap layer is a silicon nitride layer having crystallinity and has a thickness of 5 nm or more.

Also, in a second aspect of the present invention, a semiconductor wafer is provided, which includes a wafer, a nitride crystal layer formed of one or more crystal layers of group III nitride, and a cap layer, where the wafer, the nitride crystal layer and the cap layer are positioned in an order of the wafer, the nitride crystal layer and the cap layer, a layer that is of the nitride crystal layer and that is in contact with the cap layer, and a layer near the layer function as active layers of a field-effect transistor. The cap layer is a silicon nitride layer having crystallinity, and the cap layer has a thickness that is equal to or larger than a thickness in which a gate of the field-effect transistor is to be embedded.

A thickness of the cap layer can be made in a range from 5 nm to 550 nm, preferably can be 10 nm or more, more preferably can be 20 nm or more, and further preferably, can be 40 nm or more. The concept "having crystallinity" includes, in the first place, a case where an atom or a molecule has an exact periodicity in a three-dimensional space, as a single crystal or polycrystal, and also include a case where an atom or a molecule shows a certain degree of a periodicity even if the atom or the molecule does not have an exact periodicity. For example, a case where a spot pattern (an ordered spatial structure) is observed in an electron beam diffraction image is included. On the contrary, a disordered state (an amorphous state) in which only a halo pattern is observed in an electron beam diffraction image is not included in the concept "having crystallinity".

The nitride crystal layer may include an element forming layer that is in contact with the cap layer, the element forming layer may include a first crystal layer and a second crystal layer that has a larger band gap than the first crystal layer, and two-dimensional carrier gas may be generated near a hetero interface between the first crystal layer and the second crystal layer. The nitride crystal layer may include a buffer layer that is positioned closer to the wafer than the element forming layer, and stress generated in the buffer layer may cancel stress between the element forming layer and the wafer. The wafer may be a silicon wafer, and the nitride crystal layer may include a reaction suppressing layer that suppresses a reaction between a silicon atom and a group III atom.

In a third aspect of the present invention, an electronic device in which a semiconductor wafer is used is provided, where the electronic device includes a gate structure of a field-effect transistor or a wiring structure that is connected to the nitride crystal layer, and a height of the gate structure or the wiring structure is smaller than a thickness of the cap layer.

As the above-described wafer, a silicon wafer, a sapphire wafer, a GaAs wafer and the like can be given, and as an electronic device, a High Electron Mobility Transistor (HEMT), a Heterojunction Bipolar Transistor (HBT), a Light Emitting Diode (LED) and the like can be given as examples.

DESCRIPTION OF EXEMPLARY EMBODIMENTS

Embodiment 1

Figure 1:
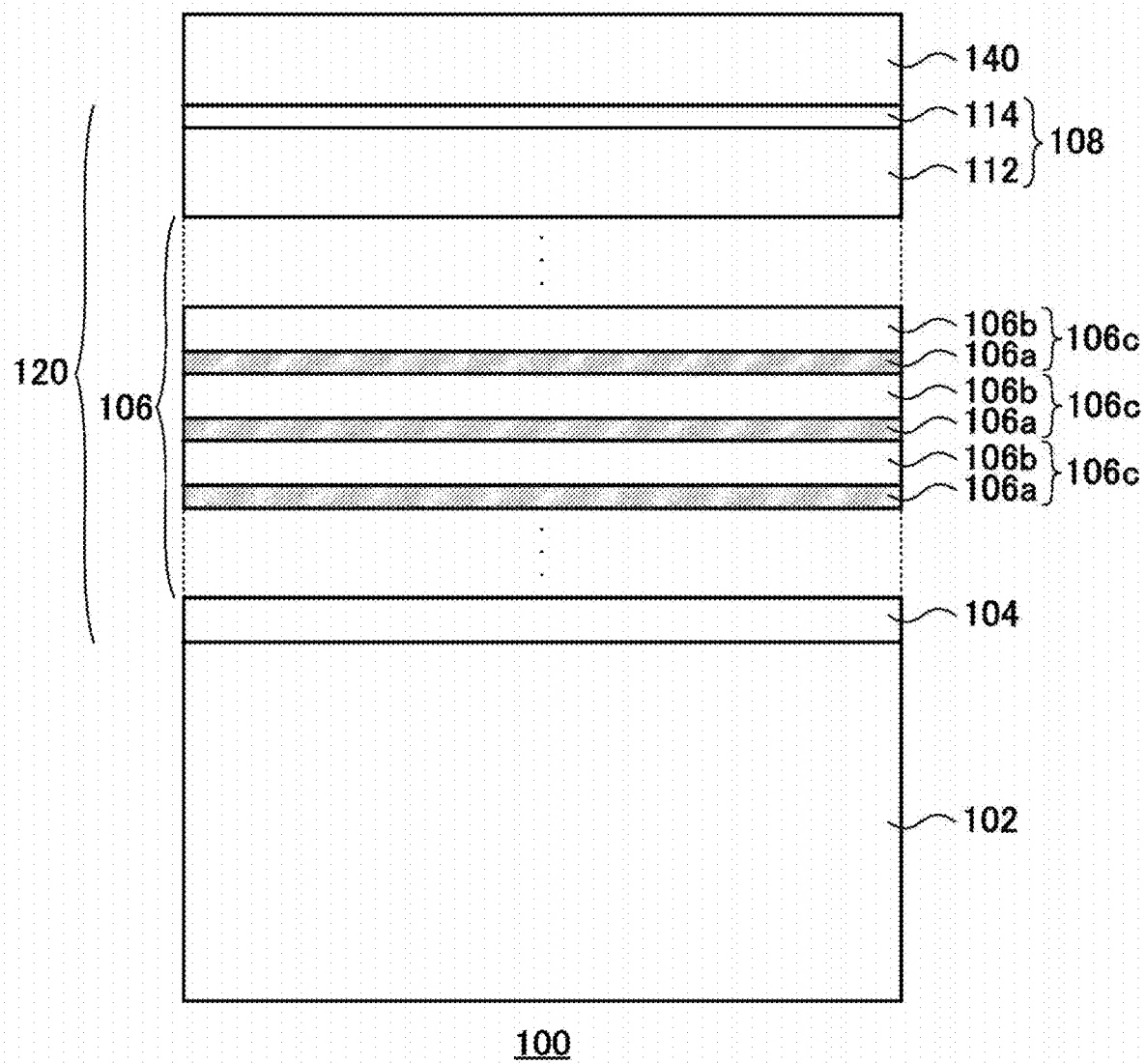
FIG. 1 shows a cross-sectional view of a semiconductor wafer 100.

FIG. 1 shows a cross-sectional view of a semiconductor wafer 100 that is used in an inspection method of the present embodiment. The semiconductor wafer 100 includes a wafer 102, a nitride crystal layer 120 and a cap layer 140, and the wafer 102, the nitride crystal layer 120 and the cap layer 140 are positioned in an order of the wafer 102, the nitride crystal layer 120 and the cap layer 140. The nitride crystal layer 120 is formed of one or more crystal layers of group III nitride. The nitride crystal layer 120 includes, for example, a reaction suppressing layer 104, a buffer layer 106 and an element forming layer 108.

The wafer 102 is a support wafer that supports the nitride crystal layer 120 and the cap layer 140. Although a material of the wafer 102 is preferably silicon, the material is not limited to this. As a material of the wafer 102, sapphire, GaAs crystal and the like can be given as examples. When silicon wafer is used as the wafer 102, material cost can be reduced, and a semiconductor manufacturing apparatus that has been used during a conventional silicon process can be utilized. Accordingly, cost competitiveness can be improved. Further, by using a silicon wafer as the wafer 102, a large-size wafer having a diameter of 150 mm or more can be industrially utilized at a cheap price.

When the wafer 102 is a silicon wafer, the reaction suppressing layer 104 suppresses a reaction between a silicon atom contained in the silicon wafer and a group III atom contained in the buffer layer 106 and the like. When the nitride crystal layer in an upper layer of the reaction suppressing layer 104 is a GaN-based semiconductor layer such as AlGaN and GaN, alloying of a Ga atom and a silicon atom contained in the GaN-based semiconductor layer and a silicon atom contained in the silicon wafer can be prevented. As the reaction suppressing layer 104, $Al_zGa_{1-z}N$ (0.9≤z≤1) can be given, and an AlN layer can be given as a representative example. According to the reaction suppressing layer 104, the surface of the wafer 102 can be protected, thereby surely supporting the upper layer. Also, the reaction suppressing layer 104 can form an initial nucleus of a crystal layer that is formed on the wafer 102. A thickness of the reaction suppressing layer 104 can be made to be 30 nm or more and 300 nm or less.

The buffer layer 106 is positioned closer to the wafer 102 than the element forming layer 108, and generates stress that cancels stress between the element forming layer 108 and the wafer 102. The buffer layer 106 has, for example, a multi-layer stack structure in which a plurality of two-layer stack structures 106c are repeatedly stacked, each two-layer stack structure 106c being formed of a first layer 106a and a second layer 106b. According to such a multi-layer stack structure, compressive stress is generated, and as a result, the buffer layer 106 functions as a stress generating layer that reduces warping of the entire semiconductor wafer 100. The buffer layer 106 also functions as an insulating layer that electrically insulates the wafer 102 and the element forming layer 108.

The first layer 106a is formed of a group III nitride crystal having a lattice constant, a1, in a bulk crystal, for example, and the second layer 106b is formed of a group III nitride crystal having a lattice constant, a2 (a1<a2), in a bulk crystal, for example. The repeated number of two-layer stack structures 106c can be made to be 2 to 500, for example. By stacking a large number of the two-layer stack structures 106c, the compressive stress generated in the buffer layer 106 can be made large. Also, the magnitude of the compressive stress generated in the buffer layer 106 can be easily controlled by the number of the stacks of the two-layer stack structures 106c. Further, by stacking a large number of the two-layer stack structures 106c, the improvement of the blocking voltage by the first layer 106a can be further enhanced.

In the present embodiment, although it is described, as an example, that the buffer layer 106 is formed by repeatedly stacking a plurality of the two-layer stack structures 106c, a plurality of two-layer stack structures 106c may not be repeatedly stacked, and in this case, the buffer layer 106 is formed of a single two-layer stack structure 106c. The buffer layer 106 may also have a structure formed of a three-layer stack including, in addition to the first layer 106a and the second layer 106b, a third crystal layer having a lattice constant, a3 (a2<a3) in a bulk crystal. Alternatively, the buffer layer 106 may also be a graded crystal layer having a lattice constant in a bulk crystal that increases in a continuous or stepwise manner in a direction away from the wafer 102. Further, the buffer layer 106 may also be a multi-layer stack structure in which a plurality of three-layer stacks or graded crystal layers are repeatedly stacked.

As the first layer 106a, $Al_qGa_{1-q}N$ ($0.9 \leq q \leq 1$) can be given as an example, and as the second layer 106b, $Al_pGa_{1-p}N$ ($0 \leq p \leq 0.3$) can be given as an example. A thickness of the first layer 106a can be made to be 1 nm or more and 20 nm or less, and preferably, can be made to be more than 5.0 nm and less than 20 nm. A thickness of the second layer 106b can be made to be 5 nm or more and 300 nm or less, and preferably, can be 10 nm or more and 300 nm or less.

The element forming layer 108 is in contact with the cap layer 140, and includes, for example, a first crystal layer 112 and a second crystal layer 114. In the element forming layer 108, any device, such as a transistor or a light emitting diode (LED), can be formed. A band gap of the second crystal layer 114 may also be larger than a band gap of the first crystal layer 112, and in this case, two-dimensional carrier gas is generated near a hetero interface between the first crystal layer 112 and the second crystal layer 114. In this case, a High Electron Mobility Transistor (HEMT) in which the two-dimensional carrier (electron) gas on the hetero interface is taken as a channel can be formed. The second crystal layer 114 may be in contact with the first crystal layer 112 and also be lattice-matched or pseudo-lattice-matched with the first crystal layer 112.

The first crystal layer 112 is, for example, an $Al_xGa_{1-x}N$ ($0 \leq x < 1$) layer, and specifically, a GaN layer can be given as an example. A thickness of the first crystal layer 112 can be selected within a range from 200 nm to 2000 nm, and can be made to be 800 nm, for example.

The second crystal layer 114 is, for example, an $Al_yGa_{1-y}N$ ($0 < y \leq 1$, $x<y$) layer, and specifically, an $Al_yGa_{1-y}N$ ($0.1<y \leq 0.3$) layer, and for example, $Al_{0.25}Ga_{0.75}N$ can be given as an example. A thickness of the second crystal layer 114 can be selected within a range from 10 nm to 100 nm, and can be made to be 25 nm, for example.

The cap layer 140 is a silicon nitride layer having crystallinity and has a thickness of 5 nm or more. The thickness of the cap layer 140 can be set within a range from 5 nm to 550 nm, and preferably, can be made to be 10 nm or more, more preferably, can be made to be 20 nm or more, and further preferably, can be made to be 40 nm or more.

By making the cap layer 140 as a silicon nitride layer, an influence of hydrogen atmosphere etching in the epitaxial growth ending step can be avoided or the influence can be made slight. Also, by making the cap layer 140 as a silicon nitride layer, various cap layers can be provided in addition to the GaN-based cap layer, and can increase a degree of freedom in device designing. Also, by making the cap layer 140 to have crystallinity and have a thickness of 5 nm or more, the uniformity of the thickness of the cap layer 140 within the wafer surface can be enhanced.

Note that the presence of the crystallinity in the cap layer 140 means that a crystal structure of the cap layer 140 is well ordered, and according to this, it is presumed that the film growth process of the cap layer 140 is in a thermal equilibrium state. Different from an amorphous film that grows in a thermal nonequilibrium state, the film growth in a thermal equilibrium state is insensitive to a growth parameter and uniformity of the film growth is easily maintained. For that reason, the within-surface uniformity of the thickness of the cap layer 140 is enhanced, and as a result, a preferable effect that enhances yield during a device manufacturing process, and the like is expectable.

Here, the concept "having crystallinity" includes, in the first place, a case where an atom or a molecule has an exact periodicity in a three-dimensional space, as a single crystal or polycrystal, and also include a case where an atom or a molecule shows a certain degree of a periodicity even if the atom or the molecule does not have an exact periodicity. For example, a case where a spot pattern (an ordered spatial structure) is observed in an electron beam diffraction image is included. On the contrary, a disordered state (an amorphous state) in which only a halo pattern is observed in an electron beam diffraction image is not included in the concept "having crystallinity".

The nitride crystal layer 120 such as the reaction suppressing layer 104, the buffer layer 106 and the element forming layer 108 can be formed using a general Metal Organic Chemical Vapor Deposition (MOCVD) method. For example, when a layer formed using the MOCVD method is an AlN layer, an AlGaN layer and a GaN layer, trimethylaluminum ($Al(CH_3)_3$) and trimethylgallium ($Ga(CH_3)_3$) can be used as the group III source gas, and ammonia ($NH_3$) can be used as nitrogen source material gas. The growth temperature can be selected within a range from 1100° C. to 1260° C., and a V/III ratio, that is, a flow rate ratio of the group V source material gas to the group III source gas can be selected within a range from 160 to 5000. Regarding a thickness of the layer to be formed, a growth time period corresponding to a designed thickness can be calculated from a growth speed obtained by a preliminary experiment, for example, and the thickness can be controlled by the growth time period.

The cap layer 140 can be formed using a Thermal Chemical Vapor Deposition (thermal CVD) method, for example. For example, silane ($SiH_4$) or silane ($Si_2H_6$) can be used as the Si source material gas, and ammonia ($NH_3$) can be used as the nitrogen source material gas. The growth temperature can be selected within a range from 1000° C. to 1260° C. Regarding the thickness of the layer to be formed, a growth time period corresponding to a designed thickness can be calculated from a growth speed obtained by a preliminary experiment, for example, and the thickness can be controlled by the growth time period. In the above-described MOCVD or thermal CVD, in addition to the source material gas, carrier gas can be used, and as the carrier gas, hydrogen gas or nitrogen gas can be given as examples.

When a field-effect transistor is formed in the element forming layer 108 that is in contact with the cap layer 140, that is, the two-dimensional carrier gas is formed on a hetero interface between the first crystal layer 112 and the second crystal layer 114, and when these crystal layers function as active layers of a transistor, the cap layer 140 can be made to be a silicon nitride layer having crystallinity and having a thickness that is equal to or more than a thickness in which a gate of the field-effect transistor can be embedded.

Embodiment 2

Figure 2:
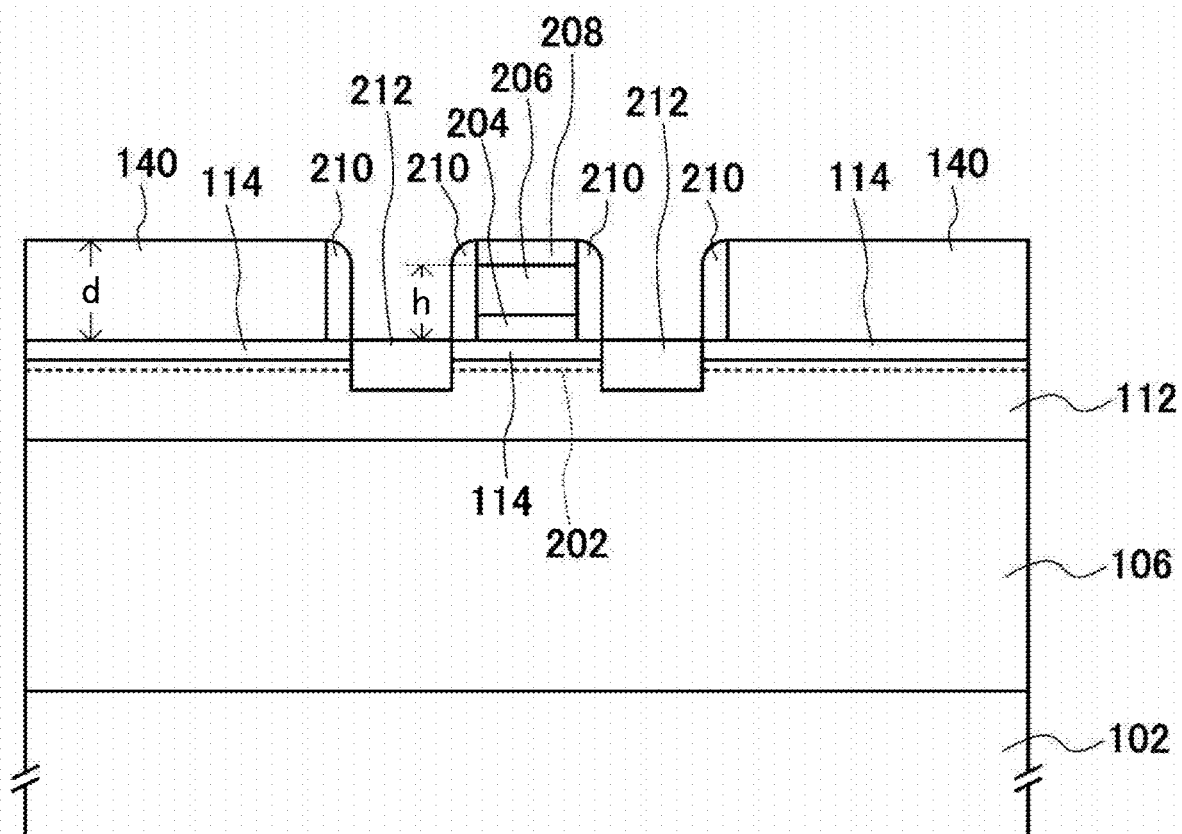
FIG. 2 shows a cross-sectional view of an electronic device 200.

FIG. 2 shows a cross-sectional view of an electronic device 200 in which a field-effect transistor is formed on the semiconductor wafer 100 described in the Embodiment 1. The electronic device 200 is formed in a semiconductor wafer including the wafer 102, the buffer layer 106, the first crystal layer 112, the second crystal layer 114 and the cap layer 140, and has a gate structure of a field-effect transistor or a wiring structure that is connected to the nitride crystal layer 120 (in particular, the first crystal layer 112 on which a two-dimensional electron gas 202 is formed, and the second crystal layer 114, and an interface therebetween), where a height of the gate structure or the wiring structure is smaller than the thickness of the cap layer 140. Note that the connection includes not only mechanical connection and physical connection but also electrical connection.

That is, the field-effect transistor of the electronic device 200 includes a gate insulating film 204, a gate electrode 206, a gate cap layer 208, a side wall 210 and a source/drain region 212, and a total height h of the gate insulating film 204 and the gate electrode 206 that are the gate structure is smaller than the thickness of the cap layer 140. This is relatively defined by comparing the thickness of the cap layer 140 to the gate structure, and makes a similar effect to the Embodiment 1. Also, in the present embodiment, by making the thickness of the cap layer 140 equal to or more than the height h of the gate structure, the cap layer 140 functions as the inter-layer insulating layer, and flattening of inter-layer films after the transistor is formed can be easily performed. As a result, it is an expectable effect that a wiring layer, a second inter-layer insulating layer, a third wiring layer, and the like to be formed on an upper layer can be easily formed. In a case where miniaturization is progressed, it is considered that the effect is more significant and the importance increases.

Figure 3:
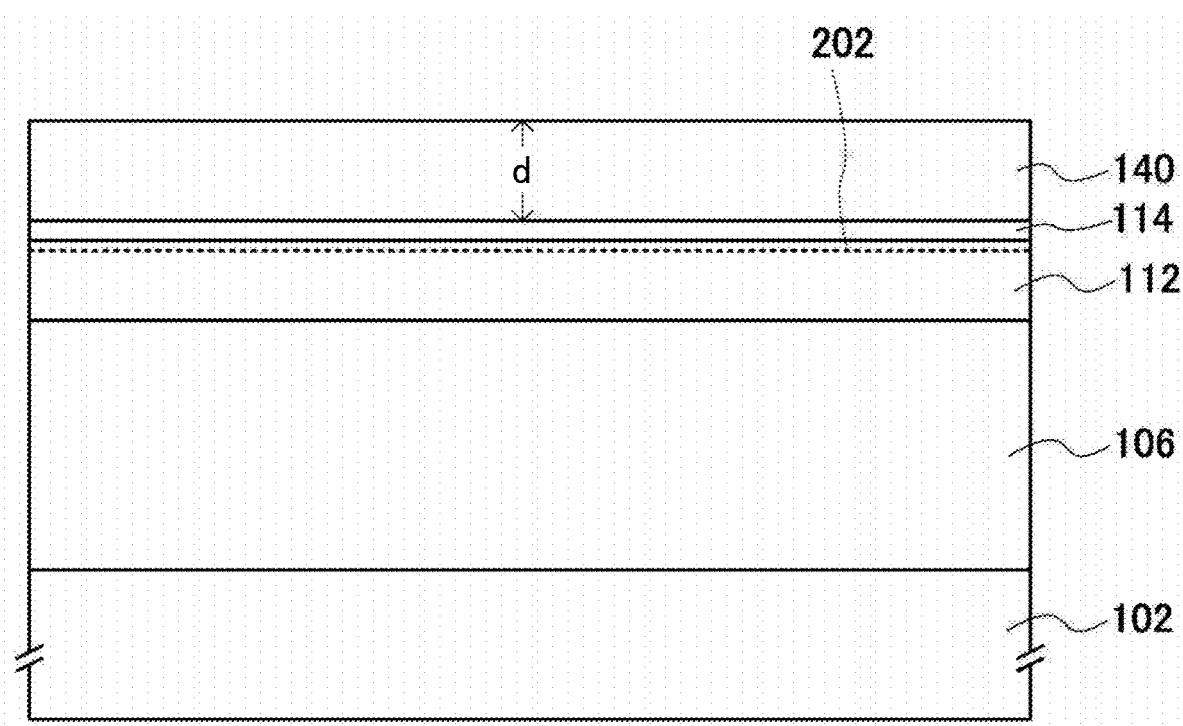
FIG. 3 shows a cross-sectional view for describing a manufacturing process of the electronic device 200.
Figure 4:
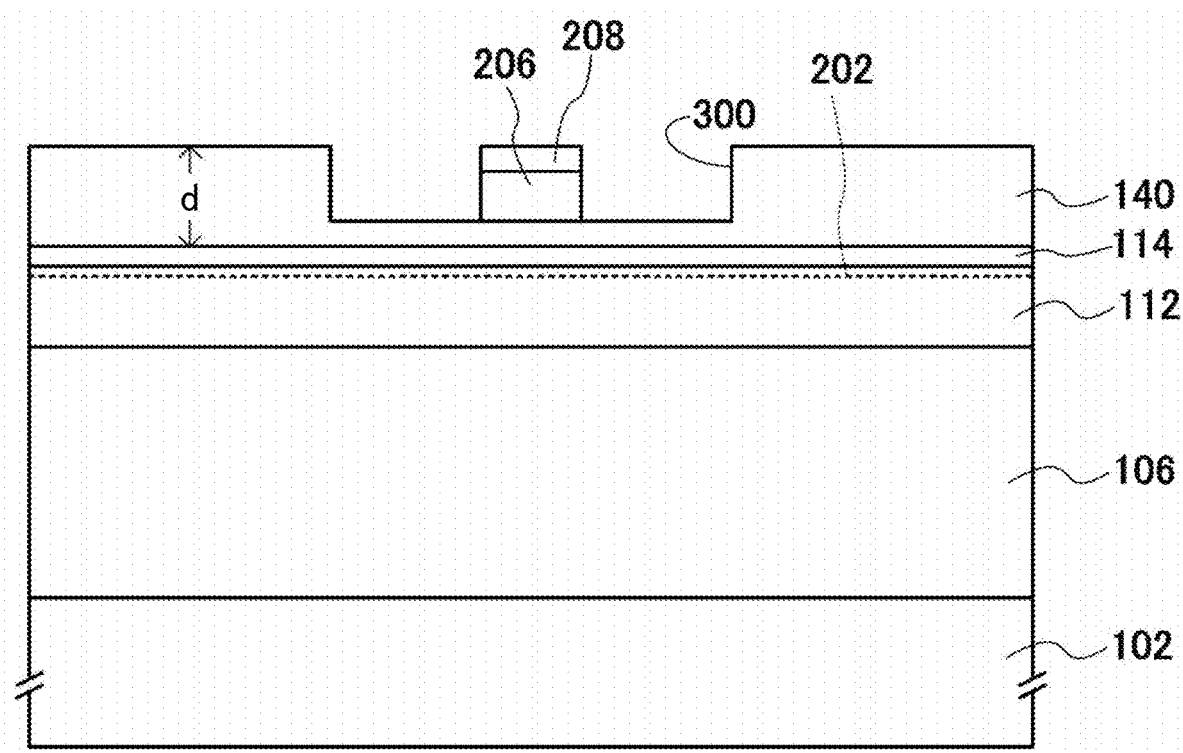
FIG. 4 shows a cross-sectional view for describing a manufacturing process of the electronic device 200.
Figure 5:
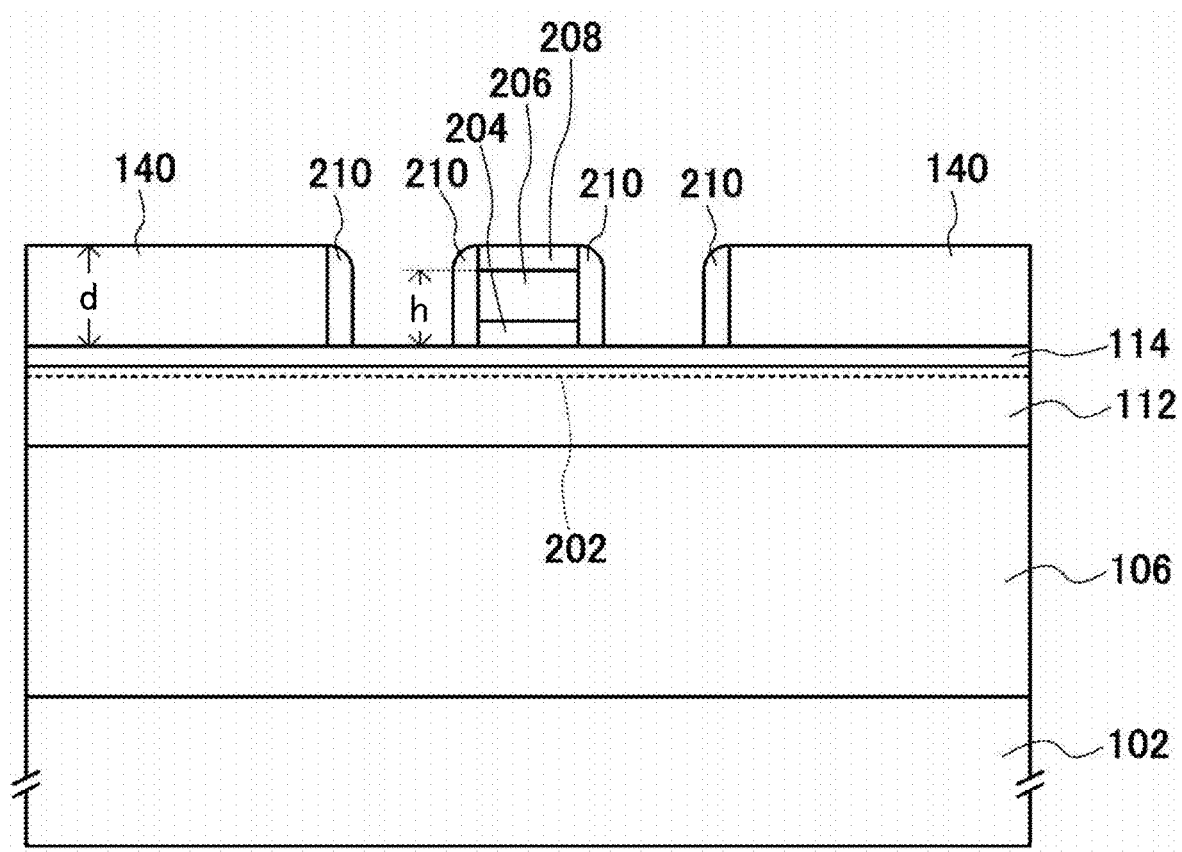
FIG. 5 shows a cross-sectional view for describing a manufacturing process of the electronic device 200.

FIG. 3 to FIG. 5 respectively show a cross-sectional view for describing a manufacturing process of the electronic device 200. As shown in FIG. 3, using a similar method to the method described in the Embodiment 1, a semiconductor wafer including a wafer 102, a buffer layer 106, a first crystal layer 112, a second crystal layer 114, and a cap layer 140 is formed. Here, the thickness of the cap layer 140 is d. Two-dimensional electron gas 202 is generated on an interface between the first crystal layer 112 and the second crystal layer 114.

As shown in FIG. 4, a groove 300 is formed in the cap layer 140, and after a coating film that is the gate electrode 206 and the gate cap layer 208 is formed, the coating film is patterned to form the gate electrode 206 and the gate cap layer 208.

As shown in FIG. 5, the gate cap layer 208 is used in a mask to etch the cap layer 140 of a bottom of the groove 300, and after a coating film that is the side wall 210 is formed, the coating film is anisotropically etched to form the side wall 210.

The gate cap layer 208 and the side wall 210 are used for a mask to form the source/drain region 212 on the first crystal layer 112 and the second crystal layer 114 of the bottom of the groove 300, by an ion implantation method, for example. In this way, the electronic device 200 of FIG. 2 is formed.

Example

A Si wafer of a diameter of 150 mm having a (111) plane as a main surface was used as the wafer 102 to form the reaction suppressing layer 104, the buffer layer 106 and the element forming layer 108. As the reaction suppressing layer 104, an AlN layer having a designed thickness of 150 nm to 160 nm was formed. As the buffer layer 106, a plurality of AlN/AlGaN stack structures (two-layer stack structures 106c) each formed of an AlN layer (first layer 106a) having a designed thickness of 5 nm and an AlGaN layer (second layer 106b) having a designed thickness of 28 nm were repeatedly stacked and formed. As the element forming layer 108, a GaN layer (first crystal layer 112) having a designed thickness of 800 nm and an AlGaN layer (second crystal layer 114) having a designed thickness of 25 nm were formed. An Al composition of the AlGaN layer (second crystal layer 114) was set to be 0.25. Further, as the cap layer 140, a $Si_3N_4$ layer having a thickness 110 nm was formed.

For the forming of the reaction suppressing layer 104, the buffer layer 106 and the element forming layer 108 (AlN layer, AlGaN layer and GaN layer), the MOCVD method was used, trimethylaluminum and trimethylgallium were used as the group III source gas, and ammonia was used as the nitrogen source material gas. The growth temperature was set within a range of 1100° C. to 1260° C. The V/III ratio, that is, the flow rate ratio of the group V source material gas to the group III source gas was selected within a range from 160 to 3700. By controlling the thickness of each layer by the growth time period calculated from the growth speed obtained by the preliminary experiment, the actual thickness of each layer is different from the designed thickness.

The thermal CVD method was used for forming the cap layer 140 ($Si_3N_4$ layer), and silane was used as the Si source material gas, and ammonia was used as the nitrogen source material gas. The growth temperature was set within a range from 1000° C. to 1260° C.

Figure 6:
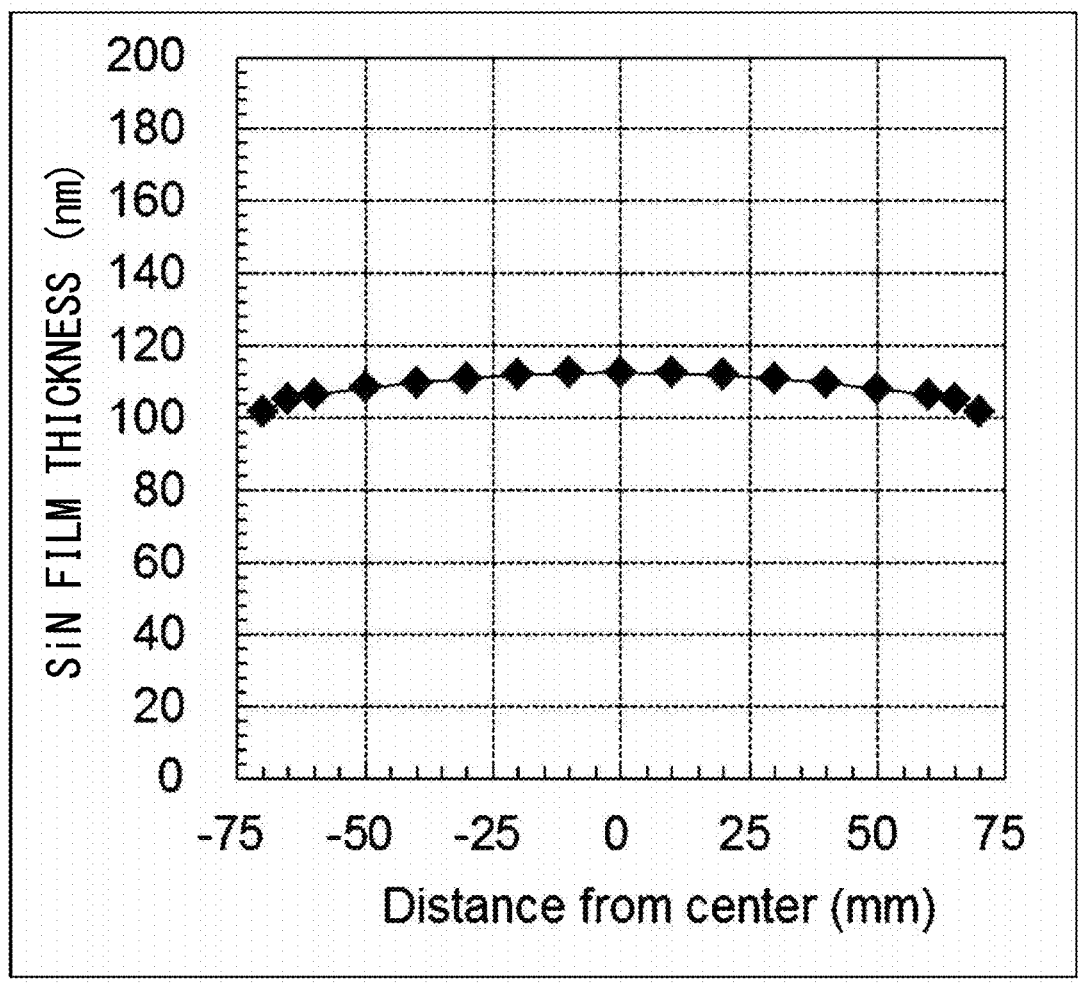
FIG. 6 shows a film thickness distribution of a cap layer 140 (SiN film) within a wafer surface.

FIG. 6 shows a film thickness distribution of the cap layer 140 within the wafer surface. Over the entire surface of the wafer having a diameter of 150 mm, the thickness was within a range of 108.6±10.9 nm, and it can be learned that the film thickness uniformity is good.

Figure 7:
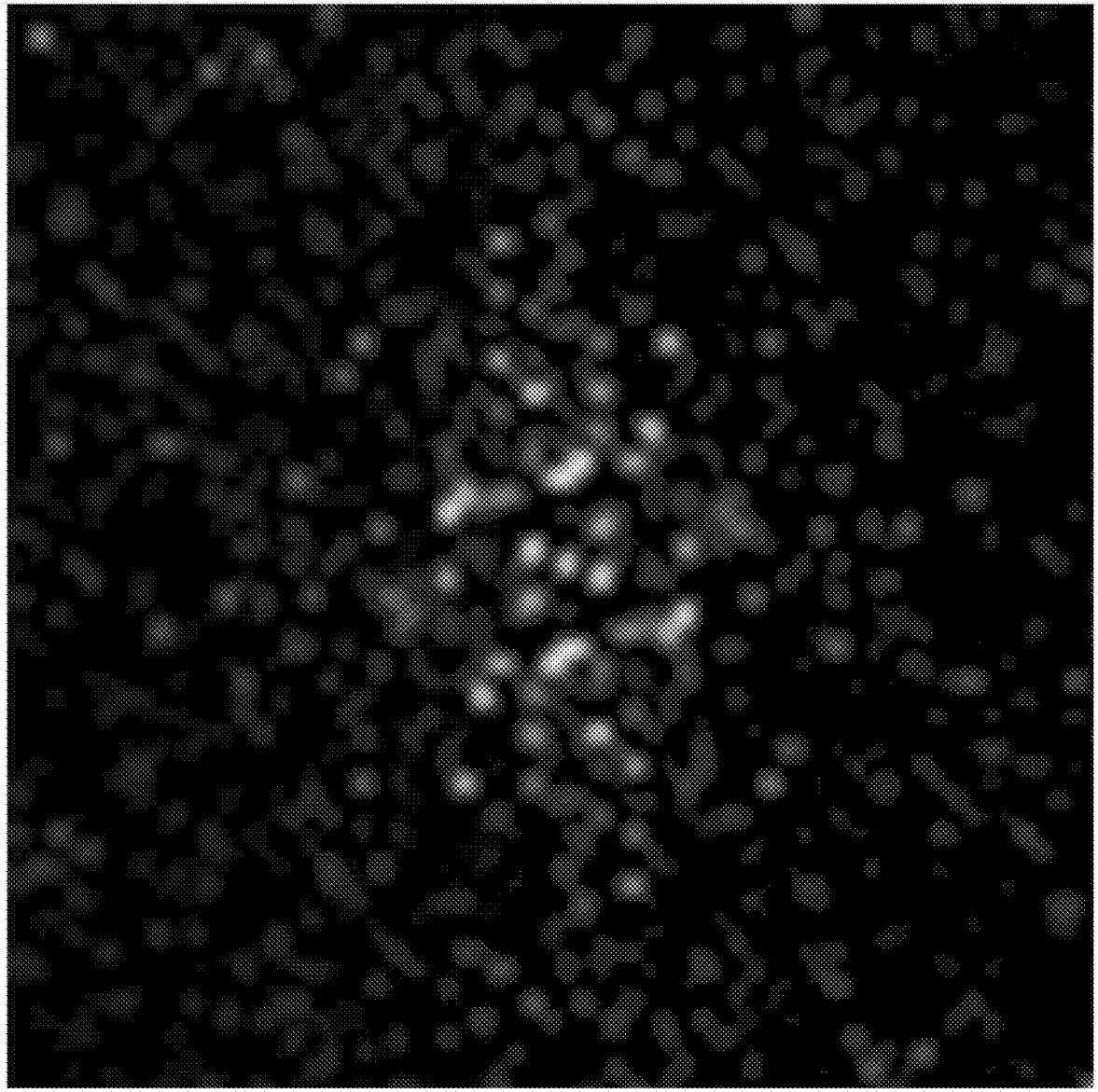
FIG. 7 shows an electron beam diffraction image of the cap layer 140 (SiN film).

FIG. 7 shows an electron beam diffraction image of the cap layer 140. Because the halo pattern cannot be observed and lots of spots (bright spots) were observed, the periodicity of the structure can be confirmed and it is known that the ordering is progressing.

EXPLANATION OF REFERENCES

100 . . . semiconductor wafer; 102 . . . wafer; 104 . . . reaction suppressing layer; 106 . . . buffer layer; 106a . . .

first layer; 106*b* . . . second layer; 106*c* . . . two-layer stack structure; 108 . . . element forming layer; 112 . . . first crystal layer; 114 . . . second crystal layer; 120 . . . nitride crystal layer; 140 . . . cap layer; 200 . . . electronic device; 202 . . . two-dimensional electron gas; 204 . . . gate insulating film; 206 . . . gate electrode; 208 . . . gate gap layer; 210 . . . side wall; 212 . . . source/drain region; 300 . . . groove

What is claimed is:

1. An electronic device comprising:
  a wafer;
  a nitride crystal layer formed of one or more crystal layers of group III nitride; and
  a cap layer, wherein
  the wafer, the nitride crystal layer and the cap layer are positioned in an order of the wafer, the nitride crystal layer and the cap layer,
  the nitride crystal layer comprises an element forming layer that is in contact with the cap layer,
  the element forming layer comprises a first crystal layer, a second crystal layer that is formed on the first crystal layer and has a larger band gap than the first crystal layer, a gate structure of a field-effect transistor formed on the second crystal layer and a source/drain region formed in the first crystal layer and the second crystal layer, and a gate insulating film formed by the same material as the cap layer,
  a two-dimensional carrier gas is generated near a hetero interface between the first crystal layer and the second crystal layer,
  the cap layer is a silicon nitride layer having crystallinity and has a thickness that is larger than a height of the gate structure.

2. The electronic device according to claim 1, wherein
  the nitride crystal layer comprises a buffer layer that is positioned closer to the wafer than the element forming layer, and
  a stress generated in the buffer layer cancels a stress generated between the element forming layer and the wafer.

3. The electronic device according to claim 2, wherein
  the wafer is a silicon wafer, and
  the nitride crystal layer comprises a reaction suppressing layer that suppresses a reaction between a silicon atom and a group III atom.

4. The electronic device according to claim 1, wherein
  a layer that is of the nitride crystal layer and that is in contact with the cap layer, and a layer near the layer function as active layers of the field-effect transistor.

5. The electronic device according to claim 1, wherein
  the wafer is a silicon wafer, and
  the nitride crystal layer comprises a reaction suppressing layer that suppresses a reaction between a silicon atom and a group III atom.

6. The electronic device according to claim 1, wherein the thickness of the cap layer is 5 nm or more.

* * * * *